United States Patent
Mauersberger et al.

(10) Patent No.: US 6,809,032 B1
(45) Date of Patent: Oct. 26, 2004

(54) METHOD AND APPARATUS FOR DETECTING THE ENDPOINT OF A CHEMICAL-MECHANICAL POLISHING OPERATION USING OPTICAL TECHNIQUES

(75) Inventors: Frank Mauersberger, Radebeul (DE);
Peter J. Beckage, Austin, TX (US);
Paul R. Besser, Sunnyvale, CA (US);
Frederick N. Hause, Austin, TX (US);
Errol Todd Ryan, Austin, TX (US);
William S. Brennan, Austin, TX (US);
John A. Iacoponi, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 212 days.

(21) Appl. No.: 10/136,513

(22) Filed: May 1, 2002

(51) Int. Cl.[7] .............................................. H01L 21/302
(52) U.S. Cl. ....................... 438/692; 438/694; 438/697; 438/699; 156/345.12; 156/345.13
(58) Field of Search ................................ 438/692, 694, 438/697, 699; 156/345.12, 345.13

(56) References Cited

U.S. PATENT DOCUMENTS

| | | | | |
|---|---|---|---|---|
| 6,028,669 A | * | 2/2000 | Tzeng .......................... 356/504 |
| 6,214,734 B1 | * | 4/2001 | Bothra et al. ................ 438/692 |
| 6,429,130 B1 | * | 8/2002 | Chuang ........................ 438/690 |

* cited by examiner

Primary Examiner—Nadine Norton
Assistant Examiner—Binh X. Tran
(74) Attorney, Agent, or Firm—Williams, Morgan & Amerson

(57) ABSTRACT

In another aspect of the present invention, a system for detecting an endpoint in a polishing process is provided. The system comprises a polishing tool, a controllable light source, a sensor, and a controller. The polishing tool is capable of polishing a surface of a semiconductor device, wherein the semiconductor device includes a first layer comprised of a first material and a second layer comprised of a second material. The first layer is positioned above the second layer. The controllable light source is capable of delivering light having one of a plurality of a preselected frequencies to the surface of the semiconductor device. The sensor is capable of detecting the light reflected from the surface of the semiconductor device. The controller is capable of determining the second material, instructing the controllable light source to deliver light of one of the frequencies in response to the second material, comparing the reflected light to a preselected setpoint, and modifying the polishing process in response to the reflected light exceeding the preselected setpoint.

15 Claims, 11 Drawing Sheets

METHOD AND APPARATUS FOR DETECTING THE ENDPOINT OF A CHEMICAL-MECHANICAL POLISHING OPERATION USING OPTICAL TECHNIQUES

BACKGROUND OF THE INVENTION

1. Field of the Invention

This invention generally pertains to semiconductor processing, and, more particularly, to polishing process layers formed above a semiconducting substrate.

2. Description of the Related Art

The manufacture of semiconductor devices generally involves the formation of various process layers, selective removal or patterning of portions of those layers, and deposition of additional process layers above the surface of a semiconducting substrate. The substrate and the deposited layers are collectively called a "wafer." This process continues until a semiconductor device is completely constructed. The process layers may include, by way of example, insulation layers, gate oxide layers, conductive layers, and layers of metal or glass, etc. It is generally desirable in certain steps of the wafer fabrication process that the uppermost surface of the process layers be approximately planar, i.e., flat, for the deposition of subsequent layers. The operation used to produce a flat, uppermost surface on a wafer is called "planarization."

One planarization operation is known as "chemical-mechanical polishing," or "CMP." In a CMP operation, an upper surface of a process layer is polished to planarize the wafer for subsequent processing steps. Both insulative and conductive layers may be polished, depending on the particular step in the manufacture. For instance, a layer of insulating material may be formed above the wafer, and a plurality of openings may be formed therein. Then, a metal layer may be deposited above the insulating layer and in the openings formed therein. Next, the metal layer may be polished with a CMP tool to remove a portion of the metal layer above the insulating layer to form conductor interconnects, such as lines and plugs, in the openings in the insulating layer. The CMP tool removes the metal process layer using an abrasive/chemical action created by a chemically active slurry and a polishing pad. A typical objective is to remove the metal process layer down to the upper surface of the insulative layer, but this is not always the case.

The point at which the excess conductive material is removed, and the embedded interconnects remain, is called the "endpoint" of the CMP operation. The CMP operation should result in an approximately planar surface with little or no detectable scratches or excess material present on the surface of the polished layer. In practice, the wafer, including the deposited, planarized process layers, are polished beyond the endpoint (i.e., "overpolished") to ensure that all excess conductive material has been removed. Excessive overpolishing increases the chances of damaging the surface of the polished layer, uses more of the consumable slurry and pad than may be necessary, and reduces the production rate of the CMP equipment. The window for the polish time endpoint can be small, e.g., on the order of seconds. Also, variations in material thickness may cause the endpoint to change. Thus, accurate in-situ endpoint detection is highly desirable.

One technique for endpoint detection involves optical reflection. Optical reflection techniques generally involve exposing the surface of the wafer to a laser light source and measuring the amount of light reflected therefrom. Generally, as a highly reflective layer, such as copper, is polished away, the underlying layer, such as a dielectric, is exposed. To the extent that the underlying layer has a different, e.g., lower, reflectivity, the amount of light reflected may change substantially as it is exposed. The variation in the reflectivity may be detected and used as an indication that the endpoint has been reached.

There are at least two significant shortcomings in optical reflection techniques. First, where the underlying layer has a reflectivity similar to that of the copper layer, the change in reflectivity may not be sufficient to trigger the endpoint detection. This is particularly true where the reflectivity is measured in situ where the "noisy" manufacturing environment may mask a small change in reflectivity.

A second problem with optical reflection techniques may arise when the coverage of the copper layer is high. That is, where the copper covers a substantial portion of the surface of the wafer (e.g., approximately 90%), even at the endpoint, the change in reflectivity may be small because of the relatively small portion of the underlying surface that will be exposed at the endpoint. This problem is exacerbated where the underlying layer has a reflectivity that is not substantially different from that of the copper layer.

The present invention is directed to overcoming, or at least reducing the effects of, one or more of the problems set forth above.

SUMMARY OF THE INVENTION

In one aspect of the present invention, a method for detecting an endpoint in a polishing process is provided. The method comprises polishing a surface of a semiconductor device, wherein the semiconductor device includes a first layer comprised of a first material and a second layer comprised of a second material. The first layer is positioned above the second layer. The material used to form the second layer is determined. Light of a first preselected frequency is delivered toward the surface of the semiconductor device, wherein the first preselected frequency is selected in response to the type of material used to form the second layer. The light reflected from the surface of the semiconductor device is detected, and compared to a preselected setpoint. The polishing process is modfied in response to the reflected light exceeding the preselected setpoint.

In another aspect of the present invention, a system for detecting an endpoint in a polishing process is provided. The system comprises a polishing tool, a controllable light source, a sensor, and a controller. The polishing tool is capable of polishing a surface of a semiconductor device, wherein the semiconductor device includes a first layer comprised of a first material and a second layer comprised of a second material. The first layer is positioned above the second layer. The controllable light source is capable of delivering light having one of a plurality of a preselected frequencies to the surface of the semiconductor device. The sensor is capable of detecting the light reflected from the surface of the semiconductor device. The controller is capable of determining the second material, instructing the controllable light source to deliver light of one of the frequencies in response to the second material, comparing the reflected light to a preselected setpoint, and modifying the polishing process in response to the reflected light exceeding the preselected setpoint.

BRIEF DESCRIPTION OF THE DRAWINGS

The invention may be understood by reference to the following description taken in conjunction with the accompanying drawings, in which like reference numerals identify like elements, and in which.

Figure 1:
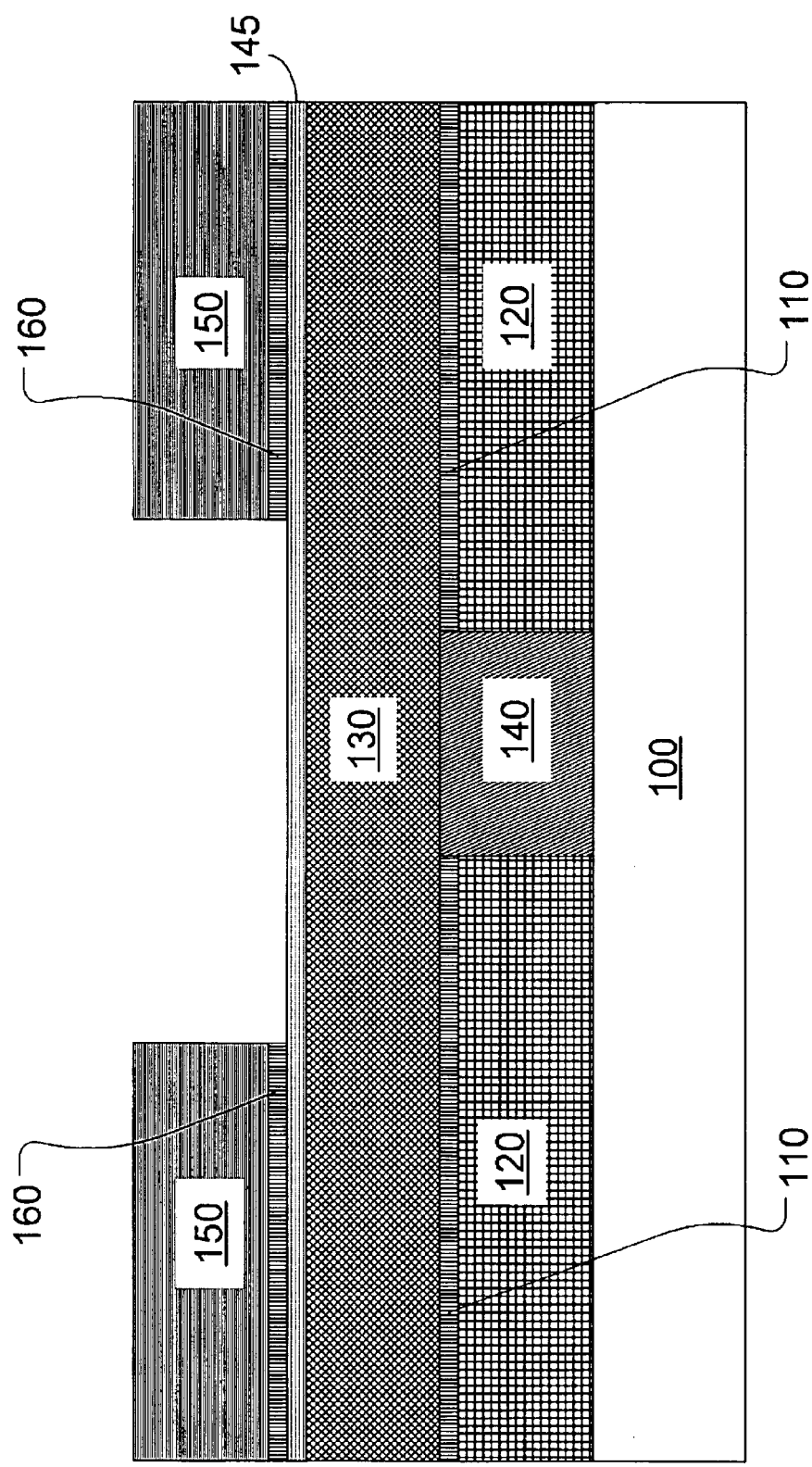
FIGS. 1–7 schematically illustrate a single-damascene copper interconnect process flow according to various embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort, even if complex and time-consuming, would be a routine undertaking for those of ordinary skill in the art having the benefit of this disclosure.

The present invention will now be described with reference to FIGS. 1–10. In general, the present invention is directed to a method and apparatus for controlling a CMP process used in the formation of a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc. Although the various regions and structures of the semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features on fabricated devices. Nevertheless, the attached drawings are included to describe and explain illustrative examples of the present invention.

While the instant invention is described herein in conjunction with the formation of copper interconnects, those skilled in the art having benefit of the description of the invention contained herein will recognize that the instant invention admits to wider application. That is, the principles of the instant invention may find application in controlling the polishing process on a wide variety of materials, and is not limited to the polishing of metals in general, or copper in particular. Nevertheless, the description of the particular embodiment contained herein may be useful in understanding the wider application of the instant invention.

As shown in FIG. 1, a first dielectric layer 120 and a first conductive structure 140 (such as a copper intermetal via connection) may be formed above a structure layer 100 such as a semiconducting substrate. However, the present invention is not limited to the formation of a copper (Cu)-based interconnect above the surface of a semiconducting substrate such as a silicon wafer, for example. Rather, as will be apparent to one skilled in the art upon a complete reading of the present disclosure, a copper (Cu)-based interconnect formed in accordance with the present invention may be formed above previously formed semiconductor devices and/or process layer, e.g., transistors, or other similar structure. In effect, the present invention may be used to form process layers on top of previously formed process layers. The structure layer 100 may be an underlayer of semiconducting material, such as a silicon substrate or wafer, or, alternatively, may be an underlayer of semiconductor devices, such as a layer of metal oxide semiconductor field effect transistors (MOSFETs), and the like, and/or a metal interconnection layer or layers and/or an interlevel (or interlayer) dielectric (ILD) layer or layers, and the like.

In a single-damascene copper process flow, according to various embodiments of the present invention, as shown in FIGS. 1–7, the first dielectric layer 120 is formed above the structure layer 100, and subsequently the first conductive structure 140 is formed in an opening therein. As shown in FIG. 1, the first dielectric layer 120 has an etch stop layer (ESL) 110 (typically silicon nitride, $Si_3N_4$, or SiN, for short) formed and patterned thereon, between the first dielectric layer 120 and a second dielectric layer 130 and adjacent the first conductive structure 140. The second dielectric layer 130 is formed above the etch stop layer (ESL) 110 and above the first conductive structure 140. The first dielectric layer 120 has the first conductive structure 140 disposed therein. If necessary, the second dielectric layer 130 may have been planarized using a chemical-mechanical polishing (CMP) process. The second dielectric layer 130 has an etch stop layer 160 (typically also SiN) formed and patterned thereon, between the second dielectric layer 130 and a patterned photomask 150. The patterned photomask 150 is formed and patterned above the etch stop layer 160.

The first and second dielectric layers 120 and 130 may be formed from a variety of dielectric materials, including, but not limited to, materials having a relatively low dielectric constant (low K materials, where K is less than or equal to about 4), although the dielectric materials need not have low dielectric constants. Examples include Applied Material's Black Diamond®, Novellus' Coral®, Allied Signal's Nanoglass®, JSR's LKD5104, and the like. The first and second dielectric layers 120 and 130 may be formed by a variety of known techniques for forming such layers, e.g., a chemical vapor deposition (CVD) process, a low-pressure CVD (LPCVD) process, a plasma-enhanced CVD (PECVD) process, a sputtering process, a physical vapor deposition (PVD) process, a spin-on coating process (such as a spin-on glass process), and the like, and each may have a thickness ranging from approximately 3000 Å–8000 Å, for example. In one illustrative embodiment, the first and second dielectric layers 120 and 130 are each comprised of Applied Material's Black Diamond®, each having a thickness of approximately 5000 Å, each being formed by being blanket-deposited by an LPCVD process for higher throughput.

An anti-reflective coating (ARC layer) 145 may also be formed on the second dielectric layer 130. The ARC layer 145 may be useful to aid in detecting an endpoint of a subsequent CMP process described herein with respect to FIGS. 6–10. Those skilled in the art having the benefit of the instant disclosure will appreciate that the ARC layer 145 need not be formed at this stage of processing, but rather, may be produced at subsequent processing stages, as described subsequently herein. Moreover, in some embodiments, the ARC layer 145 may be eliminated entirely. If used, the ARC layer 145 may be comprised of silicon rich nitride, silicon oxynitride, titanium nitride, and various organic ARC materials. Exemplary processes for forming the ARC layer 145 may include physical vapor deposition (PVD), chemical vapor deposition (CVD), and the like. In one embodiment, the ARC layer 145 has a thickness of at least about 200 Å, and may be in the range of about 200–800 Å.

The ARC layer 145 may not be needed where the material used to form the second dielectric layer 130 is selected to have a relatively low reflectivity or high absorption of monochromatic light. That is, where the semiconductor device permits the use of a relatively highly absorptive material as the second dielectric layer 130 the ARC layer 145 may not be needed to further reduce the reflectivity of the second dielectric layer 130. Exemplary materials that may be used to form the dielectric layer 130 and provide sufficient absorption include TEOS, FTEOS, SICOH, or the like. Where more absorptive materials are used to form the second dielectric layer, the ARC layer 145 may be eliminated, or at least reduced in thickness. The selection of the material used for the second dielectric layer 130 depends upon the material to be applied thereover and polished away. That is, the greater the reflectivity of an upper layer 640 (see FIG. 6), the greater the allowable reflectivity of the underlying dielectric layer 130. That is, the difference in reflectivities of the layers 130, 640 should be sufficiently large to produce a significant change in the overall reflectivity of the wafer as the layer 640 is polished away, exposing the underlying layer 130.

Figure 2:
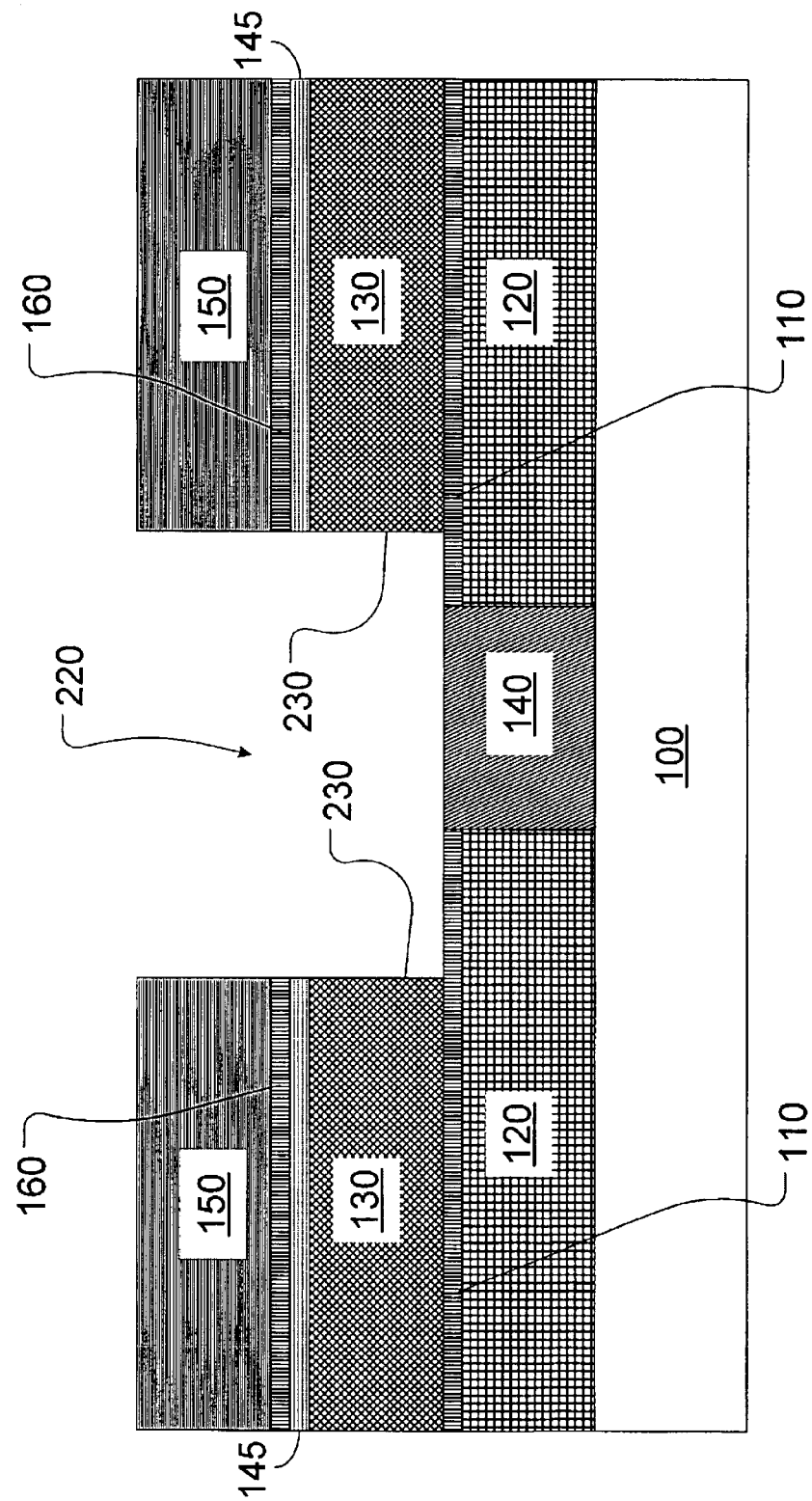

As shown in FIG. 2, a metallization pattern is then formed by using a patterned photomask 150, the etch stop layers 160 and 110 (FIGS. 1–2), and photolithography. For example, openings (such as an opening or trench 220 formed above at least a portion of the first conductive structure 140) for conductive metal lines, contact holes, via holes, and the like, are etched into the second dielectric layer 130 (FIG. 2). The opening 220 has sidewalls 230. The opening 220 may be formed by using a variety of known etching techniques, such as a reactive ion etching (RIE) process using hydrogen bromide (HBr) and argon (Ar) as the etchant gases, for example. Alternatively, an RIE process with $CHF_3$ and Ar as the etchant gases may be used, for example. Plasma etching may also be used in various illustrative embodiments. The etching may stop at the etch stop layer 110 and at the first conductive structure 140.

Figure 3:
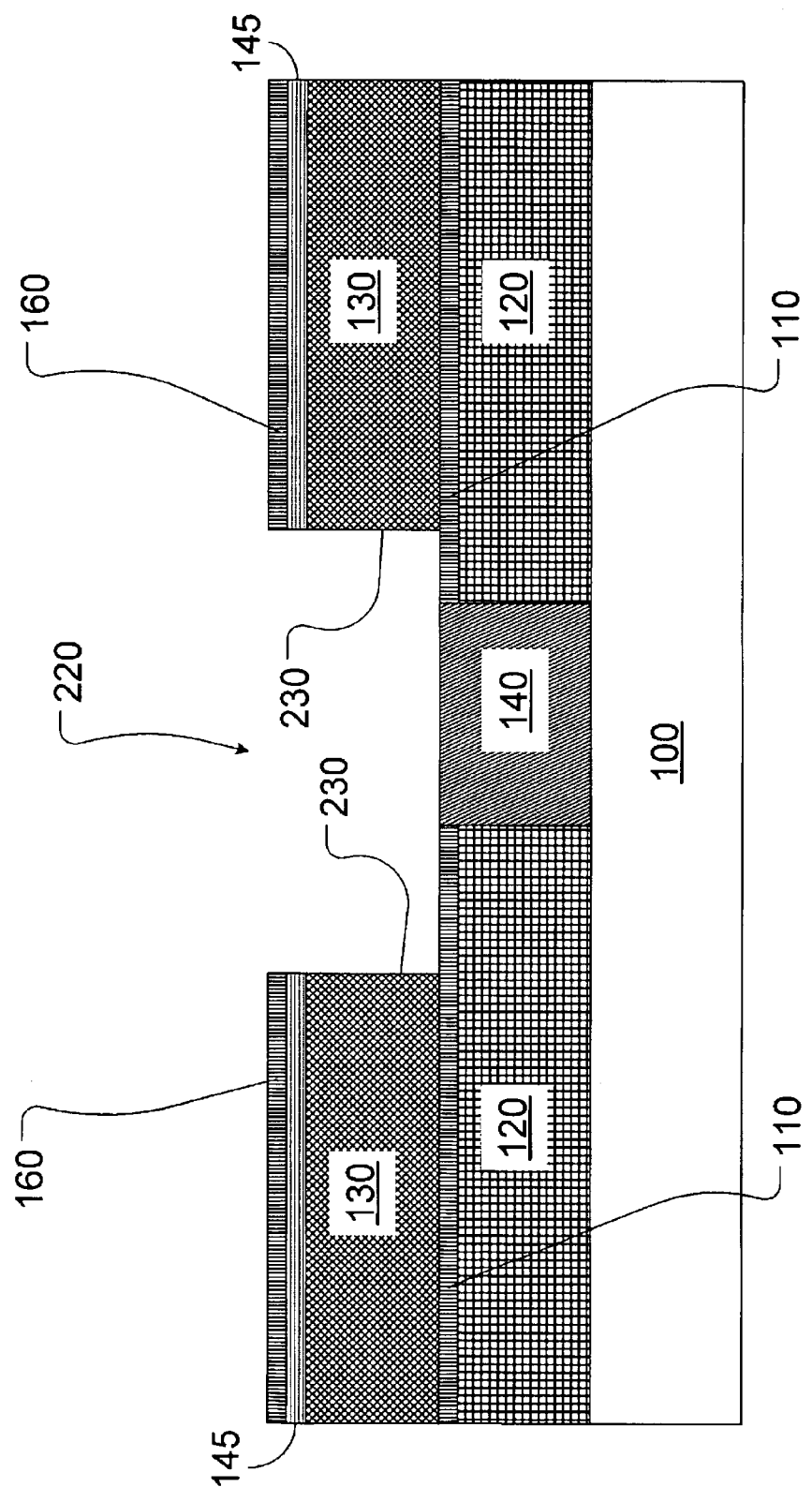

As shown in FIG. 3, the patterned photomask 150 (FIGS. 1–2) is stripped off, by ashing, for example. Alternatively, the patterned photomask 150 may be stripped using a 1:1 solution of sulfuric acid ($H_2SO_4$) to hydrogen peroxide ($H_2O_2$), for example.

Figure 4:
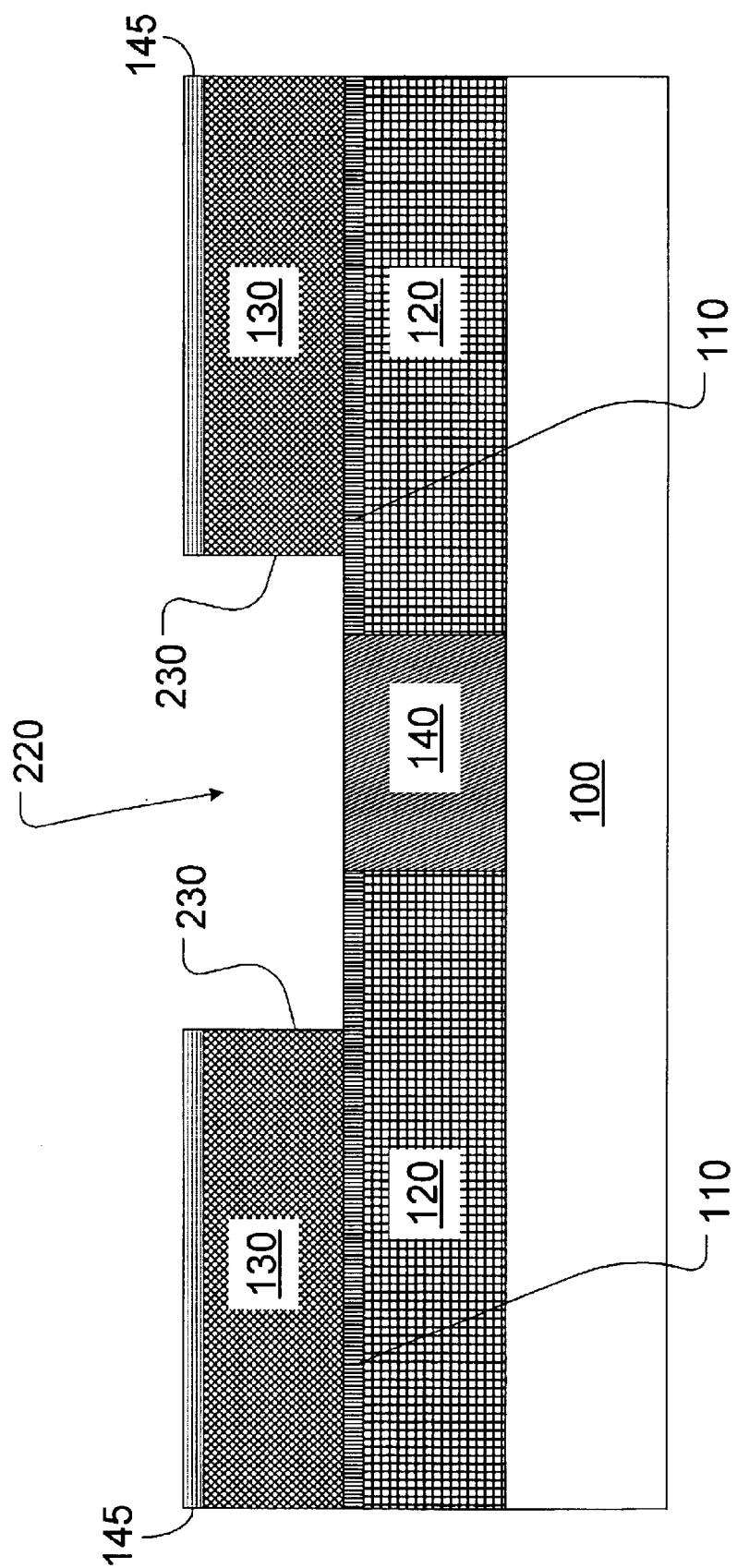

As shown in FIG. 4, the etch stop layer 160 is then stripped off, by selective etching, for example. In various illustrative embodiments, for example, in which the etch stop layer 160 comprises silicon nitride ($Si_3N_4$), hot aqueous phosphoric acid ($H_3PO_4$) may be used to selectively etch the silicon nitride ($Si_3N_4$) etch stop layer 160. In one embodiment, the ARC layer 145 remains above the second dielectric layer 130. Alternatively, if the ARC layer 145 was not initially formed above the entire second dielectric layer 130, as shown in FIG. 1, it may now be formed on at least the remaining portions of the second dielectric layer 130.

Figure 5:
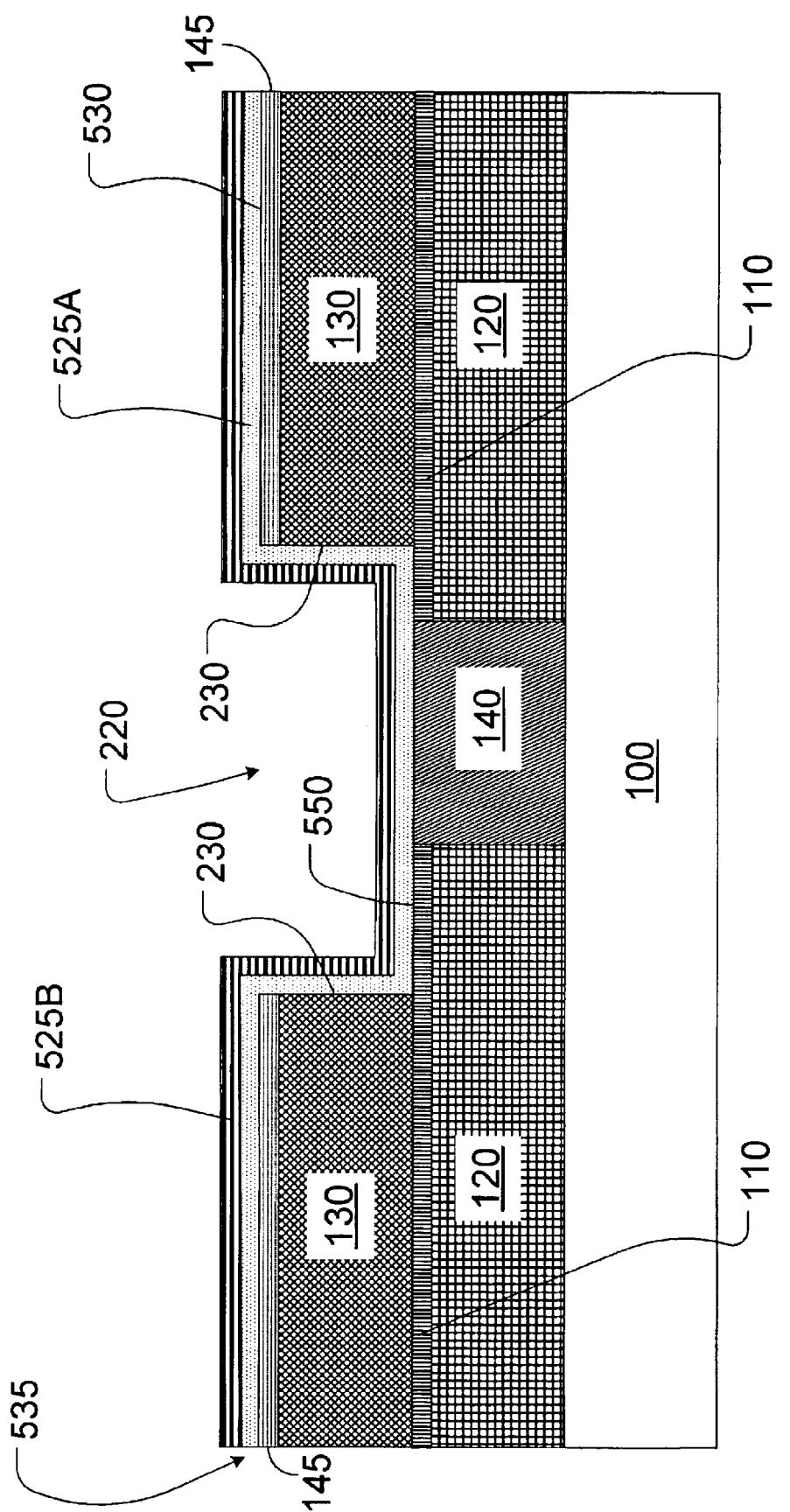

As shown in FIG. 5, a thin barrier metal layer 525A and a copper seed layer 525B (or a seed layer of another conductive material) are applied to the entire surface using vapor-phase deposition. The barrier metal layer 525A and the copper (Cu) seed layer 525B are blanket-deposited on an entire upper surface 530 of either the second dielectric layer 130 or the ARC layer 145, if present, as well as the side surfaces 230 and a bottom surface 550 of the opening 220, forming a conductive surface 535, as shown in FIG. 5.

The barrier metal layer 525A may be formed of at least one layer of a barrier metal material, such as tantalum (Ta) or tantalum nitride (TaN), and the like, or, alternatively, the barrier metal layer 525A may be formed of multiple layers of such barrier metal materials. For example, the barrier metal layer 525A may also be formed of titanium nitride (TiN), titanium-tungsten, nitrided titanium-tungsten, magnesium, a sandwich barrier metal Ta/TaN/Ta material, or another suitable barrier material. Tantalum nitride (TaN) is believed to be a good diffusion barrier to copper (Cu). Tantalum (Ta) is believed to be easier to deposit than tantalum nitride (TaN), while tantalum nitride (TaN) is easier to subject to a chemical mechanical polishing (CMP) process than tantalum (Ta). The copper seed layer 525B may be formed on top of the one or more barrier metal layers 525A by physical vapor deposition (PVD) or chemical vapor deposition (CVD), for example.

The bulk of the copper trench-fill is frequently done using an electroplating technique, where the conductive surface 535 is mechanically clamped to an electrode (not shown) to establish an electrical contact, and the structure layer 100 and overlying layers are then immersed in an electrolyte solution containing copper (Cu) ions. An electrical current is then passed through the workpiece-electrolyte system to cause reduction and deposition of copper (Cu) on the conductive surface 535. In addition, an alternating-current bias of the workpiece-electrolyte system has been considered as a method of self-planarizing the deposited copper (Cu) film, similar to the deposit-etch cycling used in high-density plasma (HDP) tetraethyl orthosilicate (TEOS) dielectric depositions.

Figure 6:
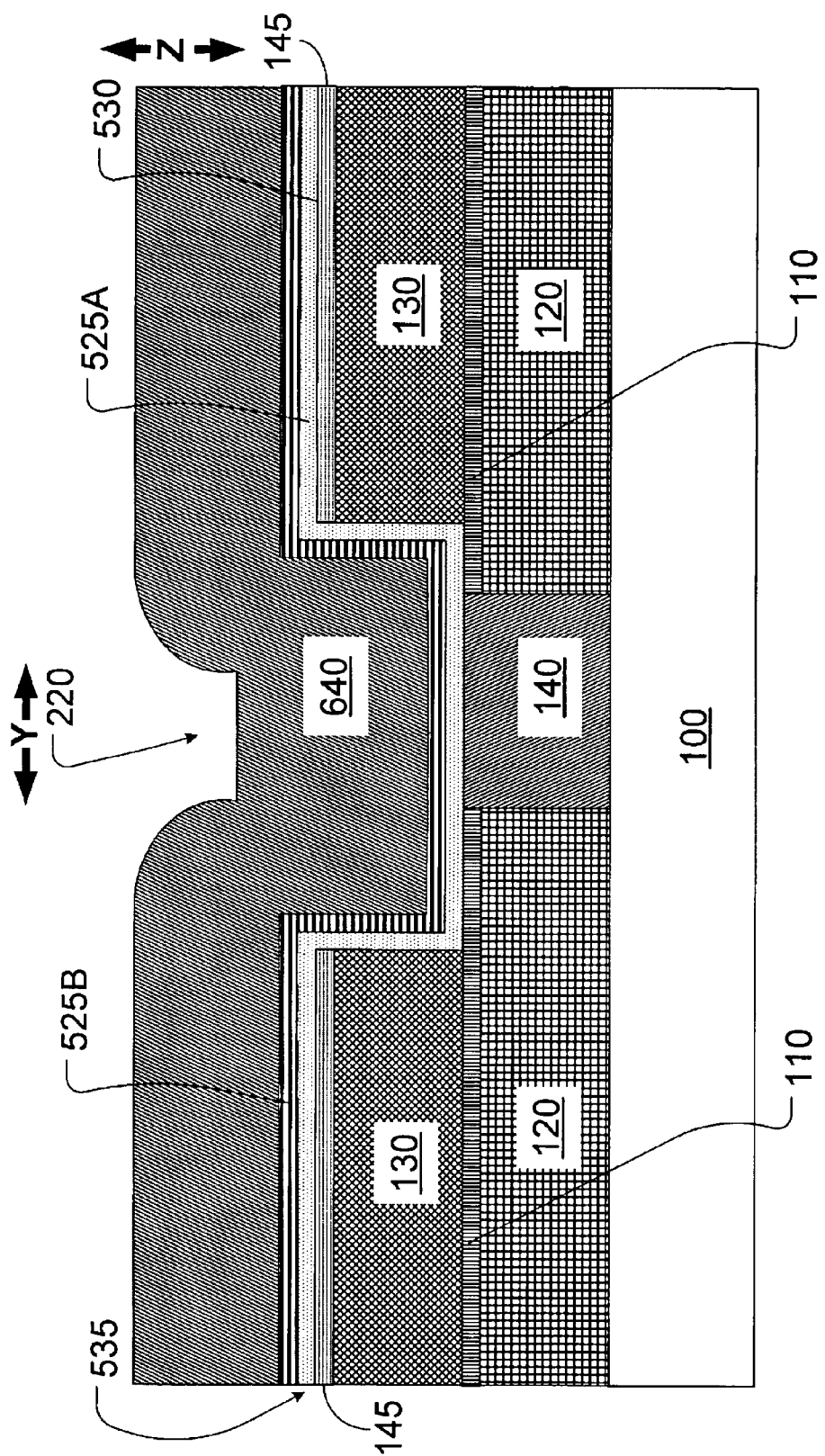

As shown in FIG. 6, this process typically produces a conformal coating of a copper (Cu) layer 640 of substantially constant thickness across the entire conductive surface 535. The copper (Cu) layer 640 may then be annealed using a rapid thermal anneal (RTA) process performed at a temperature ranging from approximately 100–400° C. for a time ranging from approximately 10–180 seconds. Alternatively, the copper (Cu) layer 640 may be annealed using a furnace anneal process at a temperature ranging from approximately 100–400° C. for a time ranging from approximately 10–90 minutes. In various alternative embodiments, the copper (Cu) layer 640 may be annealed using a rapid thermal anneal (RTA) process performed at a temperature ranging from approximately 250–350° C. for a time ranging from approximately 10–180 seconds. In still other various illustrative embodiments, the copper (Cu) layer 640 may be annealed using a furnace anneal process at a temperature ranging from approximately 250–350° C. for a time ranging from approximately 10–90 minutes.

A post-formation anneal may be used to accelerate room-temperature grain growth in the copper (Cu) layer 640, and, consequently, may affect the mechanical stress state of the copper (Cu) layer 640. In particular, the post-formation anneal of over-filled damascene openings, such as opening 220 shown in FIG. 6, affects the mechanical stress state of the copper (Cu) layer 640. For anneals performed at temperatures ranging from about 150–400° C., the copper (Cu) layer 640 is in a relatively low mechanical stress state that is effectively mechanical stress-free, or slightly compressive, since the copper (Cu) has no native oxide strengthening mechanism and since the copper (Cu) grain size is small. The copper (Cu) grain growth in the small-grained copper (Cu) layer 640 under compression will act to relax the mechanical stress. In the copper (Cu) in the opening 220 covered by the sufficiently thick layer of the copper (Cu) layer 640, it is likely that the mechanical stress in the copper (Cu) would be about zero or at least very small at the anneal temperatures ranging from about 150–400° C. The microstructure of the copper (Cu) in the opening 220 is influenced by the sufficiently thick layer of the copper (Cu) layer 640, and it is believed that the mechanical stress in the copper (Cu) in the opening 220 is also influenced by the sufficiently thick layer of the copper (Cu) layer 640.

Upon cooling from the anneal, the mechanical stress in the copper (Cu) in the opening 220 is tensile. Since the copper (Cu) of the copper (Cu) layer 640 has a thickness, measured from the bottom of the opening 220, in a range of approximately 3000 Å–8000 Å, for example, the mechanical stress in the copper (Cu) in the opening 220 is relatively small, with hydrostatic stresses in a range of from about 50 MPa to about 200 MPa.

The mechanical stress in the copper (Cu) in the opening 220 is tensile, after cooling down from the anneal, due in part to the difference in the coefficient of thermal expansion ($\Delta$CTE) between the copper (Cu) in the copper (Cu) layer 640 and the semiconducting material of the structure layer 100. For example, the coefficient of thermal expansion (CTE) for silicon (Si) is about $2.6 \times 10^{-6}/°$ C., the coefficient of thermal expansion (CTE) for copper (Cu) is about $16.6 \times 10^{-6}/°$ C., and the coefficient of thermal expansion (CTE) for aluminum (Al) is about $23.1 \times 10^{-6}/°$ C. Therefore, the difference in the coefficient of thermal expansion ($\Delta$CTE) between copper (Cu) and silicon (Si) is about $14.0 \times 10^{-6}/°$ C. For the sake of comparison, the difference in the coefficient of thermal expansion ($\Delta$CTE) between aluminum (Al) and silicon (Si) is about $20.5 \times 10^{-6}/°$ C., or about 1.46 times larger than the difference in the coefficient of thermal expansion ($\Delta$CTE) between copper (Cu) and silicon (Si). The difference in the coefficient of thermal expansion ($\Delta$CTE) is the dominant source of mechanical strain in a metallic interconnect.

The mechanical stress may be calculated from the mechanical strain using mechanical stiffness coefficients. An order of magnitude estimate of the mechanical stress may be calculated using the biaxial modulus. The biaxial modulus of silicon (Si) is about $1.805 \times 10^5$ MPa (MegaPascals), the biaxial modulus of copper (Cu) is about $2.262 \times 10^5$ MPa, and the biaxial modulus of aluminum (Al) is about $1.143 \times 10^5$ MPa, or about half the biaxial modulus of copper (Cu).

In one illustrative embodiment, copper (Cu) lines having critical dimensions of about 0.25 $\mu$m, and a thickness of approximately 4500 Å, similar to the copper (Cu) layer 640, are subjected to a post-plating anneal using a furnace anneal process performed at a temperature of approximately 250° C. for a time of approximately 30 minutes. The mechanical stresses measured along the lengths (X direction, into the page of FIG. 6) of these copper (Cu) lines are about 300 MPa, the mechanical stresses measured along the widths (Y direction, horizontal arrows in FIG. 6) of these copper (Cu) lines are about 160 MPa, and the mechanical stresses measured along the heights (Z direction, horizontal arrows in FIG. 6) of these copper (Cu) lines are about 55 MPa. The hydrostatic mechanical stress measured with these copper (Cu) lines is about 175 MPa.

These mechanical stress levels appear to be a function of the post-plating anneal temperature. By way of comparison, copper (Cu) lines having critical dimensions of about 0.25 $\mu$m, and a thickness of approximately 4500 Å, similar to the copper (Cu) layer 640, subjected to a post-plating anneal using a furnace anneal process performed at a higher temperature of approximately 500° C. for the same time of approximately 30 minutes have been measured to have the following mechanical stresses. The mechanical stresses measured along the lengths (X direction) of these copper (Cu) lines are about 600 MPa, the mechanical stresses measured along the widths (Y direction) of these copper (Cu) lines are about 470 MPa, and the mechanical stresses measured along the heights (Z direction) of these copper (Cu) lines are about 230 MPa. The hydrostatic mechanical stress measured with these copper (Cu) lines is about 440 MPa. Since hydrostatic mechanical stress is the driving force for void formation in metallic interconnects, efforts should be made to reduce this hydrostatic mechanical stress. Thus, the post-plating anneal temperature should be lowered to reduce this hydrostatic mechanical stress. For example, a post-plating furnace anneal process performed at approximately 250° C. for approximately 30 minutes, which produces a hydrostatic mechanical stress of about 175 MPa, is preferable to a post-plating furnace anneal process performed at approximately 500° C. for approximately 30 minutes, which produces a hydrostatic mechanical stress of about 440 MPa.

Figure 7:
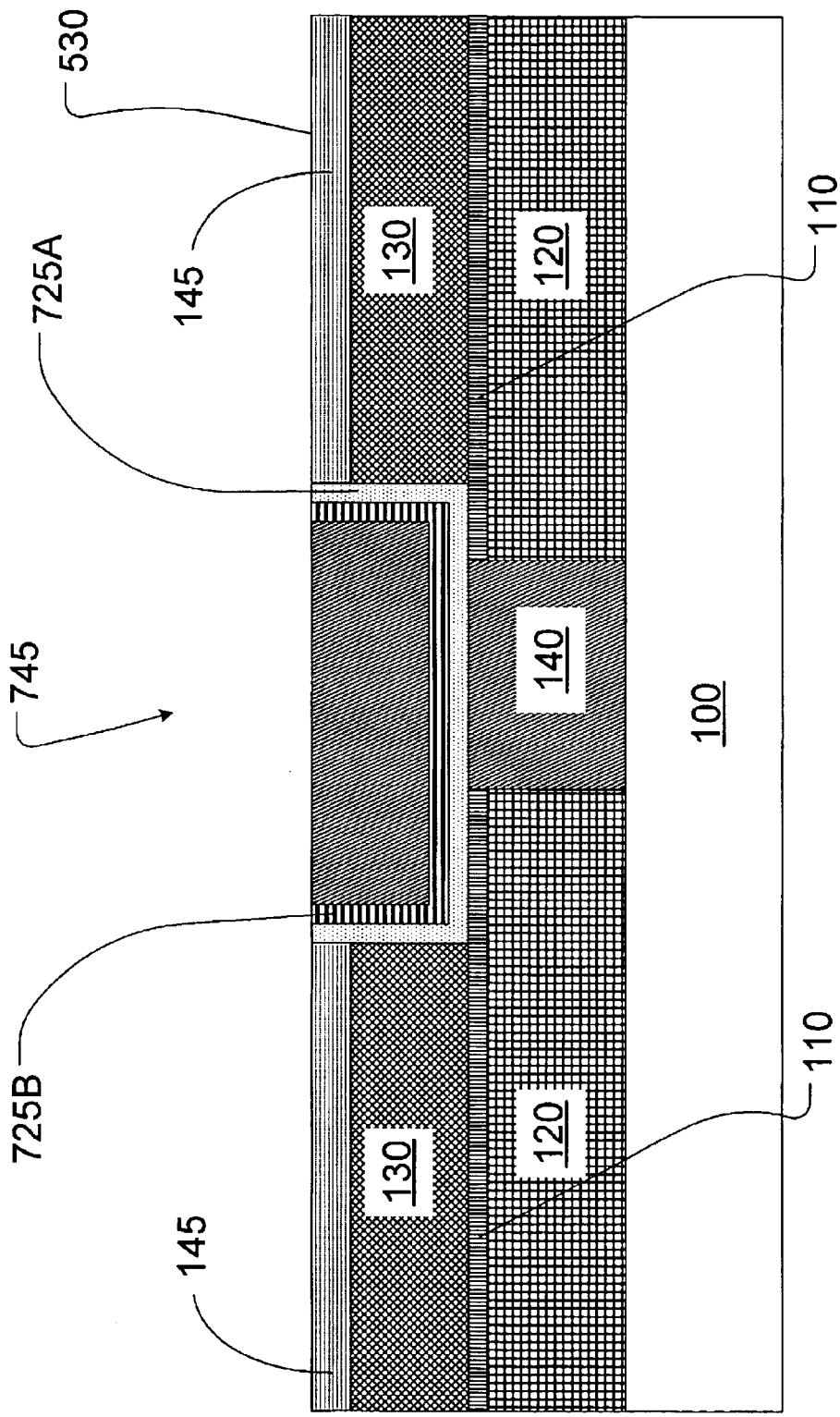

As shown in FIG. 7, following the post-deposition anneal described above, the copper (Cu) layer 640 is planarized using one or more chemical mechanical polishing (CMP) processes. The planarization using CMP clears substantially all of the copper (Cu) and barrier metal from the entire upper surface 530 of the second dielectric layer 130 or the ARC layer 145, if present, leaving a copper (Cu) portion 740 of the copper (Cu) layer 640 remaining in a metal structure such as a copper (Cu)-filled trench, forming a copper (Cu)-interconnect 745, adjacent remaining portions 725A and 725B of the one or more barrier metal layers 525A and copper seed layer 525B (FIGS. 5 and 6), respectively, as shown in FIG. 7.

Figure 8A:
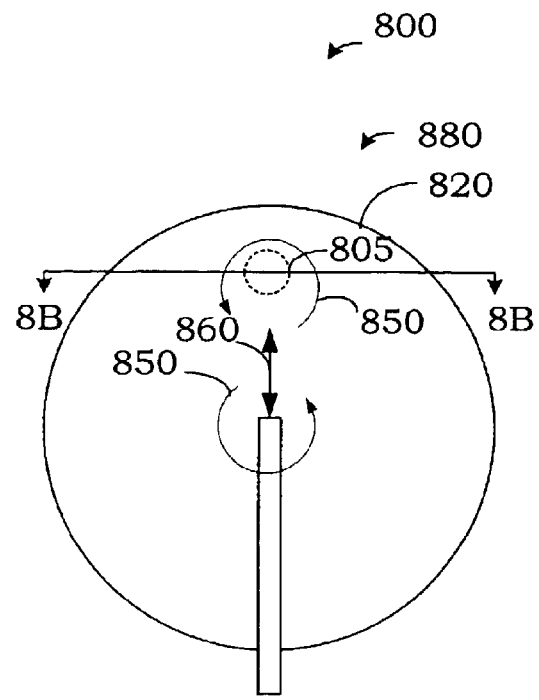
FIGS. 8A and 8B depict a CMP tool in a top plan view and in a view taken along line 8B—8B, respectively, and illustrate its operation during a CMP operation in accordance with the present invention.
Figure 8B:
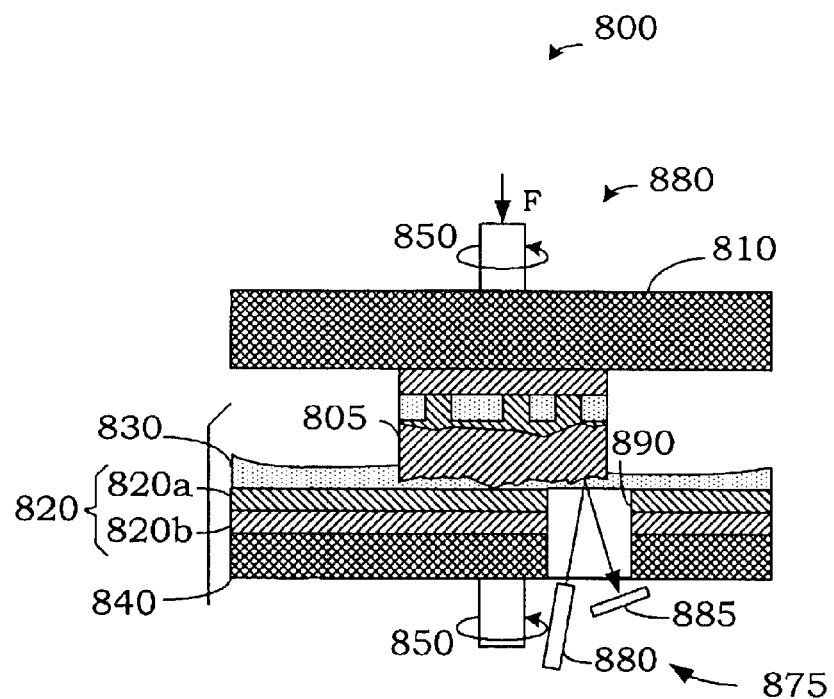

FIGS. 8A–8B conceptually illustrates a portion of CMP equipment 800 by which the CMP operation may be performed in accordance with the present invention. FIGS. 8A and 8B are not to scale. After the metal layer 640 has been formed, a wafer 805 of the type having the features shown in FIG. 6 is mounted upside down on a carrier 810. The carrier 810 pushes the wafer 805 downward with a "down-force" F. The carrier 810 and the wafer 805 are rotated above a rotating pad stack 820 on a polishing table 840 as the carrier 810 pushes the wafer 805 against the rotating pad stack 820. The pad stack 820 typically comprises a hard polyurethane pad 820a on a poromeric pad 820b. The poromeric pad 820b is a softer felt type pad and the hard polyurethane pad 820a is a harder pad used with a slurry 830. In one particular embodiment, the rotating pad stack 820 is a Rodel IC1000/Suba IV pad stack commercially available from Rodel, Inc., which may be contacted at 451 Bellevue Road, Newark, Del. 19713. The Rodel IC1000/

Suba IV pad stack includes a poromeric pad sold under that mark Rodel Suba IV and a hard polyurethane pad sold under the mark Rodel IC1000 pad. Note that the Suba IV can be considered a poromeric, but that it does not contact the wafer during polish as the Rodel IC1000 fully covers the Suba IV pad.

The slurry 830 is introduced between the rotating wafer 805 and the rotating pad stack 820 during the polishing operation. The slurry 830 contains a chemical that dissolves the uppermost process layer(s) 640 and an abrasive material that physically removes portions of the layer(s). The composition of the slurry 830 will depend somewhat upon the materials from which the layers 640 is constructed. In one particular embodiment, the layer 640 is a comprised of copper and the slurry 230 is a Semi-Sperse W-2585 slurry commercially available from the Microelectronic Materials Division of Cabot Corp., which may be contacted at 500 Commons Drive, Aurora, Ill. 60504. This particular slurry employs a silica abrasive and a peroxide oxidizer. Other wafer compositions, however, might employ alternative slurries.

The carrier 810, the wafer 805, and the pad stack 820 are rotated to polish the layer 640 to produce the interconnects 740 shown in FIG. 7. The wafer 805 and the pad stack 820 may be rotated in the same direction or in opposite directions, whichever is desirable for the particular process being implemented. In the example of FIGS. 7, the wafer 805 and the pad stack 820 are rotated in the same direction as indicated by arrows 850. The carrier 810 may also oscillate across the pad stack 820 on the polishing table 840, as indicated by arrow 860.

A system 875 for determining the endpoint of the CMP process includes a laser 880 and a sensor 885, such as a photodiode, photodiode array, charge coupled device (CCD), and the like. The laser 880 may be mounted within or below the polishing table 840 and is positioned to pass light through an opening or window 890 in the polishing table 840 and pad stack 820. The light from the laser 880 passes through the window 890 and periodically impinges upon the surface of the wafer 805 as the wafer 805 passes thereover. The laser light is reflected off the surface of the wafer 805 and is detected by the sensor 885 mounted within or below the polishing table 840. One exemplary embodiment of a system 875 that may be employed is available from LaserMax, Inc. as model No. 200A-670-5.

The intensity of the reflected light may be used as an indication of the endpoint of the CMP process. That is, as the highly reflective metal layer 640 is removed, the ARC layer 145, where used, is exposed. The ARC layer 145 reflects less of the laser light than the metal layer 640. Thus, the intensity of the reflected laser light will continue to fall until the metal layer 640 has been substantially removed from above the anti-reflective coating. Thereafter, the intensity of the reflected light will remain substantially constant until the anti-reflective coating 145 is removed, exposing the second dielectric layer 130. In one embodiment, the second dielectric layer 130 has reflectivity different from the ARC layer 145. However, the resulting reflectivity is determined by the whole stack formed by both layers 145 and 130, based on the individual reflectivity of the layers. The intensity of the reflected light will change further if the CMP process continues and removes the ARC layer 145. As discussed more fully below, this variation in the intensity of the reflected light may be used to determine the endpoint of the CMP process.

In one alternative embodiment, as discussed in conjunction with FIG. 1 above, the ARC layer 145 may be eliminated, or at least reduced in thickness, by using a relatively highly absorptive material to form the second dielectric layer 130. The highly absorptive material functions similar to the ARC layer 145 in that it reflects less of the laser light than the metal layer 640. Thus, the intensity of the reflected laser light will continue to fall until the metal layer 640 has been substantially removed from above the relatively, highly absorptive second dielectric layer 130. In one exemplary embodiment, the layer 640 may be formed from copper having a reflectivity of about 80% while being polished (reflectivity increases from reflectivity after plating because the Cu surface gets planarized, initial roughness disappears during polish), and the second dielectric layer 130 may be formed from TEOS, FTEOS, SICOH, or any dielectric material having a reflectivity of about 10 to 20%, depending on the material. The differential in reflectivity between the metal layer 640 and the dielectric stack formed by the layer 130 and the layer 145 should be at least about 10% to provide a sufficient change in reflectivity when the second dielectric layer 130 is exposed.

The change in reflectivity observed by the sensor 885 as the underlying layer 130 or ARC layer 145 is exposed may be further enhanced by selecting the frequency of the light delivered by the laser 880. That is, the materials used to form the underlying layer 130 and/or ARC layer 145 respond differently as the frequency of light to which they are exposed varies. For certain frequencies of light, the materials used to form the underlying layer 130 and/or ARC layer 145 are more or less reflective. For example, the stack of 600A RSION ARC and 2500A FTEOS, when exposed to monochromatic light having a frequency of about 248 μm, has a reflectivity of about 22%. However, when the same stack is exposed to monochromatic light having a frequency of about 193 μm, its reflectivity will decrease.

Figure 11:
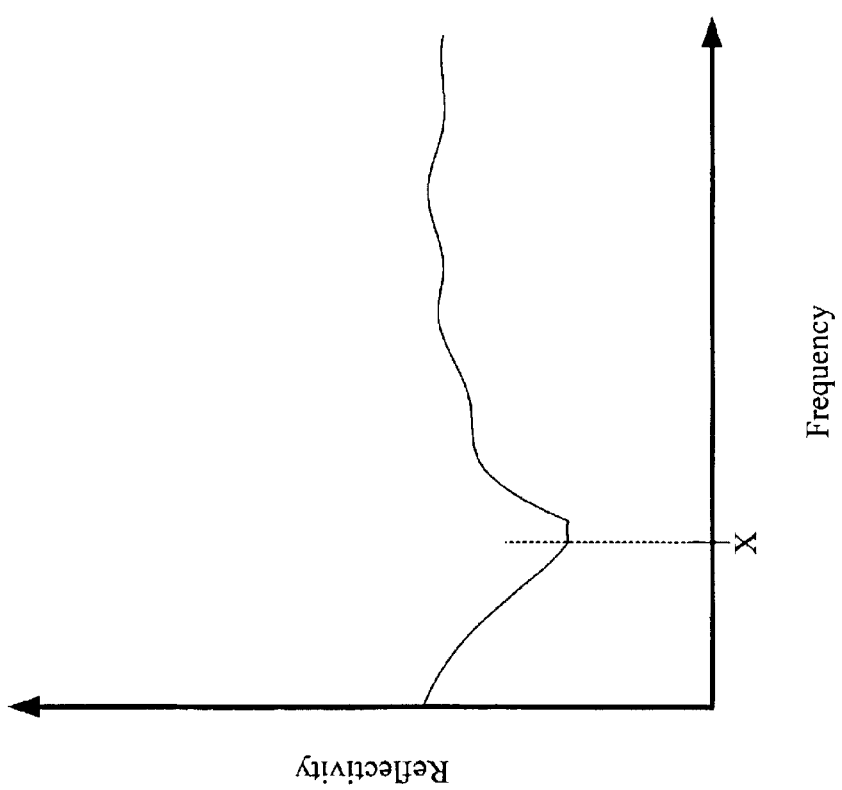
FIG. 11 illustrates an exemplary graphical representation of reflectivity versus frequency of a light source.

A graphical representation of the reflectivity of one exemplary material used to form the underlying layer 130 and/or ARC layer 145 over a range of light frequencies is shown in FIG. 11. The reflectivity varies somewhat over a range of frequencies, but has a significant low point or region at about a frequency X. Generally, by using a laser 880 that produces light at about the frequency X, a differential in the magnitudes of the reflected light from the underlying layer 130 and/or ARC layer 145 as compared to the layer 640 can be increased. That is, by using light at about the frequency X, the largest change in the magnitude of the reflected light will be seen when the underlying layer 130, 145 is exposed by the CMP process.

In one embodiment, the laser 880 may be varied by a control input signal to produce the desired light frequency. Thus, the single laser 880 may be employed during CMP processes that include a variety of different underlying materials 130, 145. Alternatively, a variety of different lasers 880, each producing its own unique light frequency, or range of frequencies, may be disposed to pass light through the window 890, as needed.

Some materials may exhibit more than one region of reduced reflectivity. Where more than one region exists, laser light having a frequency falling within any of these regions may be employed. Generally, the frequency of the light source is selected to be within at least one of the regions of reduced reflectivity. The reflectivity of each material used for the underlying layers 130, 145 may be determined either empirically or theoretically. A series of test wafers, each having a layer of each type of material used to form the underlying layers 130, 145 may be exposed to light in a range of frequencies, and the reflectivity measured. Based on these measurements, graphs of the type illustrated in FIG.

11 may be produced. These graphs may then be analyzed to locate regions of reduced reflectivity, and then a corresponding frequency of the laser light may be used to detect the endpoint of the CMP process.

Figure 9:
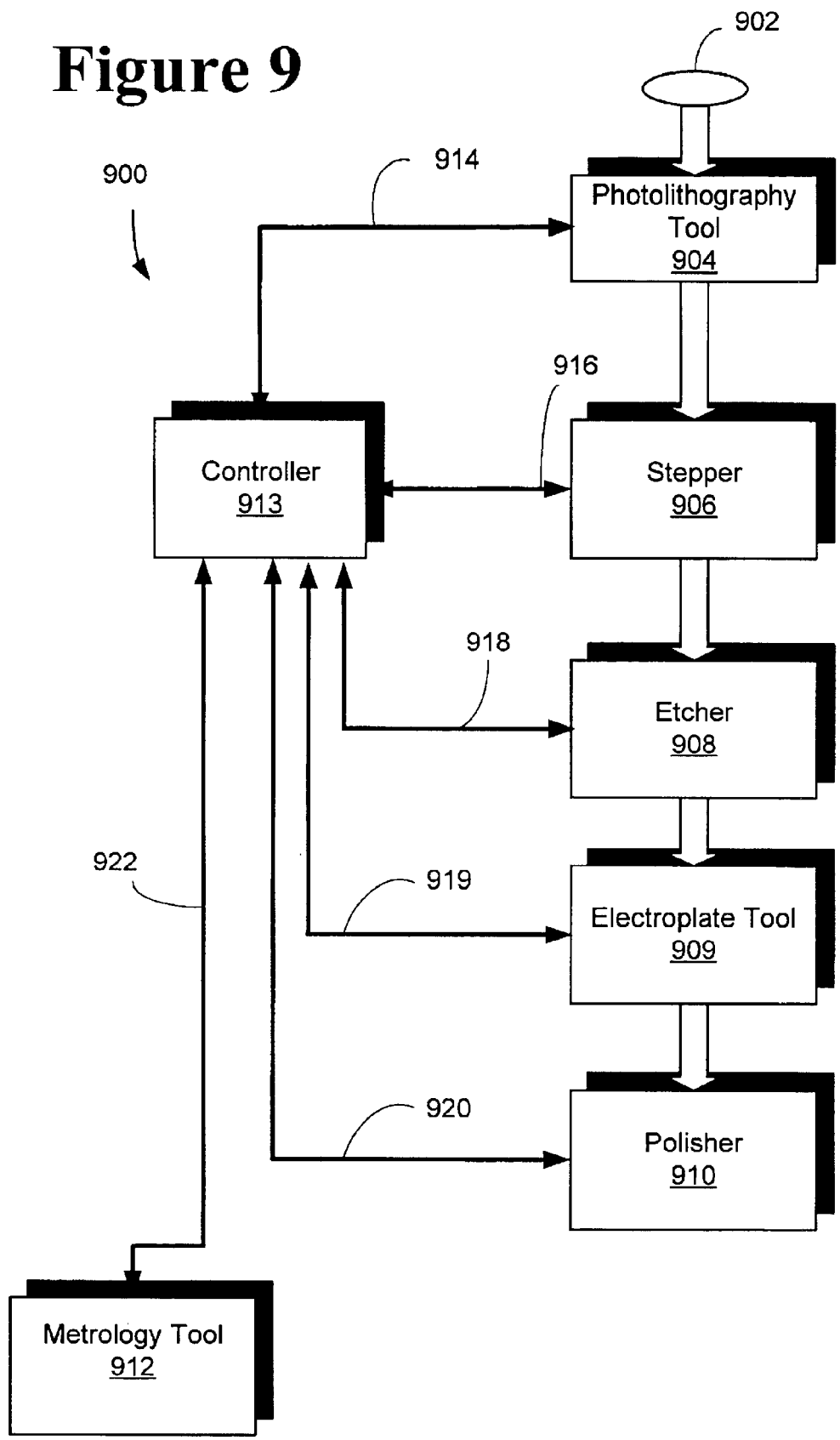
FIG. 9 schematically illustrates one embodiment of a control system useful in manufacturing semiconductor devices having features of the type illustrated in FIGS. 1–7.

Turning now to FIG. 9, one illustrative embodiment of a system 900 that may be used to produce the features of the semiconductor device depicted in FIGS. 1–7 is shown. The system 900 processes wafers 902 and is generally comprised of a photolithography tool 904, a stepper 906, an etcher 908, an electroplate tool 909, a polisher 910, a metrology tool 912, and a controller 913. The wafer 902 is generally serially processed within each of the tools 904–910. Those skilled in the art will appreciate that more or fewer tools may be included in the system 900 as is warranted to produce the desired features on the wafer 902.

Generally, the photolithography tool 904 forms a layer of photoresist on the wafer 902. The stepper 906 controllably exposes the layer of photoresist to a light source through a mask or reticle to produce a desired pattern in the layer of photoresist. The etcher 908 removes those portions of layers underlying the layer of photoresist that are exposed by the patterning produced by the mask to produce openings and/or holes in a desired pattern. The electroplate tool 909 forms a layer or film of copper on the surface of the wafer 902, filling the openings and/or holes. The polisher 910 removes the copper layer with the exception of the portion of the copper layer within the openings and/or holes.

The metrology tool 912 may be used at various stages of the process to measure select parameters of the wafer 902, such as physical characteristics and/or electrical properties, and/or the characteristics of the waste 880 or CMP by-product. The measured physical characteristics may include thickness of the copper layer, feature sizes, depth of an etching process, etc. The measured electrical properties may include resistance, conductivity, voltage levels, etc. In some embodiments, the metrology tool 912 may not be needed, as sufficient feedback information for controlling parameters of the tools 904–910 may be obtained from sensors within the tools 904–910. For example, the system 875 deployed in the polisher 910 may provide sufficient measurements of the reflectivity of the surface of the wafer 902 to allow the controller 913 to accurately determine the endpoint of the CMP process.

In some embodiments of the instant invention additional tools (not shown) may be deployed in the manufacturing line, such as additional metrology tools 912 positioned to measure certain mechanical or electrical parameters of the wafer 902 at various steps in the manufacturing process. Alternatively, additional tools may be deployed, such as, intermediate the etcher 908 and the electroplate tool 909. These intermediate devices may perform additional processes, such as cleaning, rinsing, forming additional layers, etc. Moreover, it is anticipated that the formation of some of the features on the wafer 902 will be produced by operations performed by the tools 904–911 other than in the order illustrated. For example, it may be useful to route the wafer 902 through the photolithography tool 904, stepper 906 and etcher 908 a plurality of times before delivering the wafer 902 to the electroplate tool 909.

The controller 913 of FIG. 9 may take a variety of forms. For example, the controller 913 may be included within the tools 904–910, or it may be a separate device electrically coupled to the tools 904–910 via lines 914–922, respectively. In the embodiment illustrated herein, the controller 912 takes the form of a computer that is controlled by a variety of software programs. Those of ordinary skill in the art having the benefit of this disclosure will appreciate that the controller 913 need not rely on software for its functionality, but rather, a hardware controller may be used to provide the functionality described herein and attributed to the controller 913. Further, the controller 913 need not be coupled only to the tools 904–911, but rather, could be coupled to and involved in controlling or collecting data from other devices involved in the manufacture of semiconductor devices.

In the illustrated embodiment, the automatic process controller 913 is a computer programmed with software to implement the functions described. However, as will be appreciated by those of ordinary skill in the art, a hardware controller (not shown) designed to implement the particular functions may also be used. Moreover, the functions of the controller described herein may be performed by one or more processing units that may or may not be geographically dispersed. Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantifies within the computer system's registers and memories into other data similarly represented as physical quantities within the computer system memories or registers or other such information storage, transmission or display devices.

An exemplary software system capable of being adapted to perform the functions of the automatic process controller 913, as described, is the KLA Tencor Catalyst system offered by KLA Tencor, Inc. The KLA Tencor Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999— Provisional Specification for CIM Framework Advanced Process Control Component) specifications are publicly available from SEMI.

Figure 10:
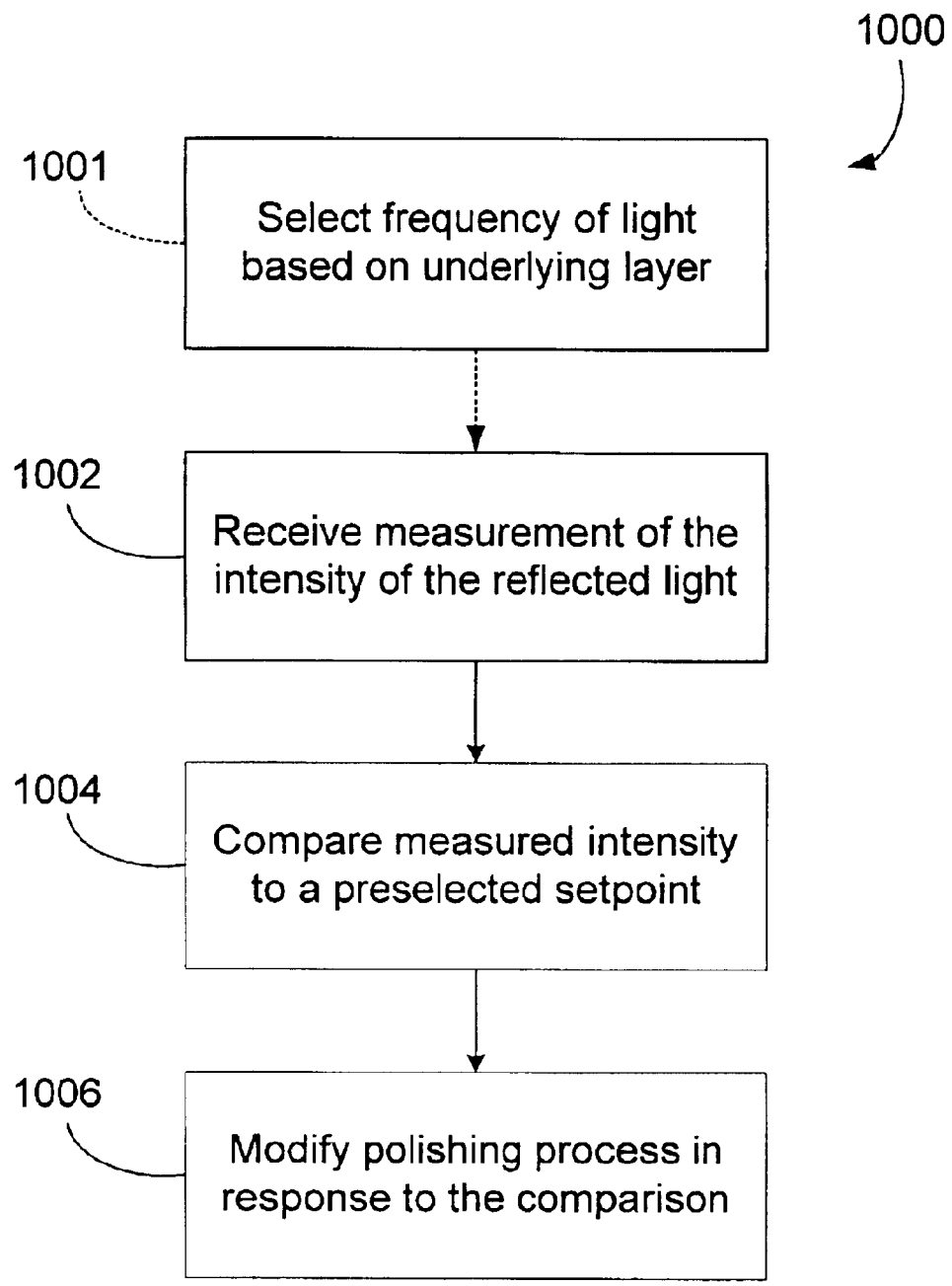
FIG. 10 illustrates one embodiment of a flowchart of a process executed by a controller of FIG. 9.

FIG. 10 illustrates one embodiment of a flowchart of a process 1000 that may be executed by the controller 913 to effect control of the polishing process. The process 1000 begins at block 1001 with the controller 913 selecting the frequency of the laser light based on the underling layer 130, 145. That is, where a programmable laser 880 is used, the controller 913 may instruct the laser 880 to produce the desired frequency light. Alternatively, the controller 913 may activate one of a plurality of lasers 880, where the activated laser 880 produces light having a frequency corresponding to the region of reduced reflectivity of the material used to form the underlying layers 130, 145. Additionally, the controller 913 may instruct an operator to replace the laser 880 with one that produces the desired frequency light before allowing the CMP process to continue. The controller 913 may "know" the type of material used to form the underlying layer 130, 145 based upon a recipe used to form the wafer 902, by operator input, or the like.

At block 1002, the controller 913 receives information from the sensor 880 regarding the intensity of the monochromatic light reflected off the surface of the wafer 902. That is, the sensor 880 periodically measures the intensity of the reflected light and provides the measured intensity to the controller 913.

In block 1004, the controller 913 compares the detected intensity to a preselected setpoint so as to identify the point at which the polishing process has substantially completely removed the layer 640. The setpoint may be selected by either empirical or theoretical methods. That is, the CMP process may be closely monitored on test wafers so as to identify the setpoint at which the desired level of polishing is observed. This empirically determined setpoint may then be used in the process described herein.

Alternatively, rather than use a single setpoint, the controller may look for a preselected change or trend in the measured reflectivity to indicate that the reflectivity of the surface of the wafer 902 is changing, which indicates that the ARC layer 145 or relatively, highly absorptive second dielectric layer 130 is being exposed. For example, where the difference in reflectivity of the copper layer 640 and the ARC layer 145 or relatively, highly absorptive second dielectric layer 130 is relatively small, the controller 913 may be programmed to respond to a relatively small change in the measured reflectivity. Alternatively, where the difference in reflectivity of the copper layer 640 and the ARC layer 145 or relatively, highly absorptive second dielectric layer 130 is larger, the controller 913 may be programmed to respond to a relatively larger change in the measured reflectivity.

In block 1006, the controller 913 instructs the polisher 910 to modify its operation in response to the measured concentration exceeding the preselected setpoint. Modifying the operation of the polisher 910 may include discontinuing its operation. Alternatively, it may be useful to modify the operation of the polisher 910 by altering one or more of the parameters of the polishing process. That is, as the measured reflectivity approaches the setpoint, indicating that the polish process is complete, it may be useful to reduce or slow the rate of polish by reducing the speed of the oscillation/rotation of the polisher 910, by varying the type of abrasive in the slurry, by varying the chemical etchant in the slurry, by varying the temperature, by varying the downforce, and the like. Thus, the polish process may proceed relatively rapidly until near completion. Thereafter, the polishing process may be slowed so as to affect a higher degree of control over the polishing process.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for detecting an endpoint in a polishing process, the method comprising:
   polishing a surface of a semiconductor device, wherein the semiconductor device includes a first layer comprised of a first material and a second layer comprised of a second material, said first layer being positioned above said second layer;
   determining a frequency range in which the material used to form the second layer has a reduced reflectivity;
   delivering light of a first preselected frequency toward the surface of the semiconductor device, wherein the first preselected frequency is within the determined frequency range;
   detecting the light reflected from the surface of the semiconductor device;
   comparing the reflected light to a preselected setpoint; and
   modifying the polishing process in response to the reflected light exceeding the preselected setpoint.

2. The method of claim 1 wherein modifying the polishing process in response to the reflected light exceeding the preselected setpoint further comprises discontinuing the polishing process in response to the difference exceeding the preselected setpoint.

3. The method of claim 1 wherein delivering light of a first preselected frequency toward the surface of the semiconductor device further comprises energizing one of a plurality of light sources, where each of said plurality of light sources has a preselected frequency of light associated therewith.

4. The method of claim 1 wherein delivering light of a first preselected frequency toward the surface of the semiconductor device further comprises controllably varying the frequency of light of a light source to be at about the first preselected frequency.

5. The method of claim 1 wherein detecting the light reflected from the surface of the semiconductor device further comprises periodically detecting the light reflected from the surface of the semiconductor device.

6. The method of claim 5 wherein comparing the reflected light to a preselected setpoint further comprises determining a difference in the periodic measurments.

7. The method of claim 6 wherein comparing the different to a preselected setpoint and modifying the polishing process in response to the reflected light exceeding the preselected setpoint further comprises modifying the polishing process in response to the difference exceeding the preselected setpoint.

8. An apparatus for detecting end setpoint in a polishing process, the apparatus method comprising:
   means for polishing a surface of a semiconductor device, wherein the semiconductor device includes a first layer comprised of a first material and second layer comprised of a second material, said first layer being positioned above said second layer;
   means for determining a frequency range in which the material used to form the second layer has a reduced reflectivity;
   means for delivering light of a first preselected frequency toward the surface of the semiconductor device, wherein the first preselected frequency is within the determined frequency range;

means for detecting the light reflected from the surface of the semiconductor device;

means for comparing the reflected light to a preselected setpoint; and means for modifying the polishing process in response to the reflected light exceeding the preselected setpoint.

9. A method for detecting a endpoint in a polishing process, the method comprising:

polishing a surface of a semiconductor device, wherein the semiconductor device includes a first layer comprised of a first material and a second layer comprised of a second material, said first layer being positioned above said second layer;

determining the type of material used to form the second layer;

identifying at least one frequency region having reduced reflectivity from the type of material used to form the second layer;

delivering light having a frequency falling within the reduced reflectivity frequency region toward the surface of the semiconductor device;

detecting the light reflected from the surface to the semiconductor device;

comparing the reflected light to a preselected setpoint; and modifying the polishing process in response to the reflected light exceeding the preselected setpoint.

10. The method of claim 9 wherein modifying the polishing process in response to the reflected light exceeding the preselected setpoint further comprises discontinuing the polishing process in response to the difference exceeding the preselected setpoint.

11. The method of claim 9 wherein delivering light having a frequency falling within the reduced reflectivity frequency region toward the surface of the semiconductor device further comprises energizing one of a plurality of light sources, where each of said plurality of light sources has a preselected frequency of light associated therewith.

12. The method of claim 9 wherein delivering light having a frequency falling within the reduced reflectivity frequency region toward the surface of the semiconductor device further comprises controllably varying the frequency of light of a light source to be within the reduced reflectivity frequency region.

13. The method of claim 9 wherein detecting the light reflected from the surface of the semiconductor device further comprises periodically detecting the light reflected from the surface of the semiconductor device.

14. The method of claim 13 wherein comparing the reflected light to preselected setpoint further comprises determining a difference in the periodic measurements.

15. The method of claim 14 wherein comparing the difference to a preselected setpoint and modifying the polishing process in response to the reflected light exceeding the preselected setpoint further comprises modifying the polishing process in response to the difference exceeding the preselected setpoint.

\* \* \* \* \*